United States Patent
La Malfa et al.

(10) Patent No.: US 7,120,062 B2
(45) Date of Patent: Oct. 10, 2006

(54) METHOD FOR SOFT-PROGRAMMING AN ELECTRICALLY ERASABLE NONVOLATILE MEMORY DEVICE, AND AN ELECTRICALLY ERASABLE NONVOLATILE MEMORY DEVICE IMPLEMENTING THE SOFT-PROGRAMMING METHOD

(75) Inventors: Antonino La Malfa, Catania (IT); Marco Messina, Augusta (IT)

(73) Assignee: STMicroelectroniics S.r.l., Agrate Brianza (IT)

( * ) Notice: Subject to any disclaimer, the term of this patent is extended or adjusted under 35 U.S.C. 154(b) by 0 days.

(21) Appl. No.: 10/779,856

(22) Filed: Feb. 17, 2004

(65) Prior Publication Data
US 2004/0223361 A1 Nov. 11, 2004

(30) Foreign Application Priority Data
Feb. 17, 2003 (IT) .......................... TO2003A0115

(51) Int. Cl.
*G11C 16/04* (2006.01)
(52) U.S. Cl. ................................ 365/185.24; 365/185.3
(58) Field of Classification Search ............. 36/185.24, 36/185.29, 185.33; 365/785.24, 185.29, 365/185.3, 185.33
See application file for complete search history.

(56) References Cited

U.S. PATENT DOCUMENTS

| | | | | |
|---|---|---|---|---|
| 5,311,466 A | * | 5/1994 | Natale et al. | 365/185.33 |
| 5,576,992 A | * | 11/1996 | Mehrad | 365/185.33 |
| 5,784,314 A | * | 7/1998 | Sali et al. | 365/185.24 |
| 6,091,642 A | * | 7/2000 | Pasotti et al. | 365/185.24 |
| 6,363,013 B1 | * | 3/2002 | Lu et al. | 365/185.24 |
| 6,490,197 B1 | * | 12/2002 | Fasoli | 365/185.33 |
| 6,522,585 B1 | * | 2/2003 | Pasternak | 365/185.3 |
| 6,587,903 B1 | * | 7/2003 | Roohparvar | 365/185.24 |

* cited by examiner

*Primary Examiner*—Trong Phan
(74) *Attorney, Agent, or Firm*—Lisa K. Jorgenson; Dennis M. de Guzman; Seed IP Law Group PLLC

(57) ABSTRACT

Described herein is a method for soft-programming an electrically erasable nonvolatile memory device, wherein soft-programming is carried out with a soft-programming multiplicity equal to twice that used for writing data in the memory device until the current absorbed during soft-programming is smaller than or equal to the maximum current which is available for writing operations and which can be generated within the memory device, and with a soft-programming multiplicity equal to the one used for writing data in the memory device in the case where the current absorbed during soft-programming with double multiplicity is greater than the maximum current which is available for writing operations and which can be generated within the memory device.

21 Claims, 4 Drawing Sheets

METHOD FOR SOFT-PROGRAMMING AN ELECTRICALLY ERASABLE NONVOLATILE MEMORY DEVICE, AND AN ELECTRICALLY ERASABLE NONVOLATILE MEMORY DEVICE IMPLEMENTING THE SOFT-PROGRAMMING METHOD

BACKGROUND OF THE INVENTION

1. Field of the Invention

The present invention relates to a method for soft-programming an electrically erasable nonvolatile memory device and to an electrically erasable nonvolatile memory device implementing the soft-programming method.

2. Description of the Related Art

As is known, nonvolatile memories comprise a memory array formed by memory cells arranged in rows and columns, in which wordlines connect gate terminals of memory cells arranged on the same row and bitlines connect drain terminals of memory cells arranged on the same column.

It is likewise known that in a nonvolatile floating-gate memory cell the storage of a logic state is carried out by programming the threshold voltage of the memory cell through the definition of the quantity of electrical charge stored in the floating-gate region.

According to the information stored, the memory cells are distinguished into erased memory cells (logic state stored "1"), in which no electrical charge is stored in the floating-gate region, and in written or programmed memory cells (logic state stored "0") in which there is stored in the floating-gate region an electrical charge sufficient to determine a sensible increase in the threshold voltage of the memory cells.

In nonvolatile memories, moreover, the memory array is generally divided into sectors, each one of which is formed by a set of memory cells on which it is possible to carry out simultaneously the same operation, generally an erasure operation. In particular, in nonvolatile memories organized into sectors it is possible to carry out reading and programming of individual memory cells of a sector and simultaneous erasure of all the memory cells of the sector, and the latter operation is rendered possible by the fact that the memory cells belonging to the same sector have source terminals connected to one another.

Erasure of a nonvolatile memory carried out sector by sector is a cumulative operation, i.e., it acts simultaneously and indistinctly on all the memory cells of the sector, and is very complex in so far as it requires not just some preparatory steps to be carried out prior to executing the erasure proper, during which the electrical charges in the floating-gate region are extracted and consequently the threshold voltage of the memory cells themselves is reduced, but also requires verifications and possible modifications subsequent to the erasure proper in the case where the result of the erasure is not fully satisfactory.

In particular, to erase a sector there is first of all performed an operation of pre-conditioning, also known as "program-all-0", i.e., an operation whereby all the memory cells of the sector are taken to the programmed state irrespective of their current state. This is due to the fact that, if there were to be erased a sector in which some of the memory cells are written but others are already erased, during the erasure there would occur an over-erasure of the memory cells already erased, which, with a fair degree of likelihood, would become depleted memory cells, i.e., memory cells that have negative threshold voltage and thus drain a current even when their gate terminal is set at ground voltage. These depleted memory cells are particularly troublesome in so far as they simulate the constant presence of erased memory cells in the respective columns to which they belong and thus cause all the memory cells belonging to said columns to be read as erased irrespective of their actual state.

In order to prevent this phenomenon and to render the history of all the memory cells belonging to the same sector uniform, there is hence performed the step of writing the entire sector, and then, following upon the operation of pre-conditioning, all the memory cells of the sector are programmed.

Next, there is carried out the erasure step proper, during which the electrical charges in the floating-gate region are extracted, and consequently the threshold voltage of the memory cells is reduced.

In order to carry this out, between the source terminal and the gate terminal of each memory cell there is applied a high electric field such as to enable the electrons to abandon the floating-gate region thanks to the so-called Fowler-Nordheim tunnelling effect.

The application of the electrical potential necessary to extract the electrical charges from the floating-gate region can occur in different ways. One of the methodologies that can, for example, be used to extract the electrical charges from the floating-gate region is known in the literature as "negative gate erasure" and basically envisages leaving floating the drain terminal of the memory cell to be erased and applying to the gate terminal a negative voltage pulse having typically an amplitude of 10 V and a time duration of the order of 10 ms, and to the source and body terminals a succession of voltage pulses the amplitude of which is variable in staircase fashion from a minimum value of 3 V to a maximum value of 8 V, with steps of 300 mV.

At the end of the erasure pulse, there is then carried out an operation of verification on all the memory cells of the sector in order to check the value of their threshold voltages, and this verification is made by performing a marginated reading that will guarantee correct recognition of the memory cell in the normal reading mode.

In particular, the verification operation scans all the memory cells of the sector and is interrupted when a memory cell that does not pass the test is found. At this point the next erasure pulse is applied. Hence, the erasure process consists in the application of an erasure pulse, followed by a subsequent step of verification until all the memory cells have a threshold voltage lower than a reference threshold voltage, which is the threshold voltage of the reference memory cell used during the verification operation. Once the voltage pulses applied to the source and body terminals have reached their maximum amplitude, if the memory cells of the sector are not yet all erased, then there is envisaged a second step of pure electrical erasure, during which further erasure pulses are applied both to the gate terminals and to the source and body terminals of the memory cells of the sector, up to a given maximum number, in which the amplitude of the pulses applied to the source and body terminals of the memory cells is equal to the maximum amplitude envisaged.

At the end of pure electrical erasure, all the memory cells of the sector have threshold voltages presenting a basically gaussian distribution, on which there is superimposed a possible "tail" due to the depleted memory cells.

The sector erasure step cannot, however, yet be deemed concluded because it is still necessary to ensure that there will not be depleted memory cells that can induce errors during the reading step. As previously mentioned, in fact, since these memory cells have a negative threshold voltage and thus drain a current even when their gate terminals are set at ground voltage, they can vitiate the subsequent operation of reading of the memory device in so far as they simulate the constant presence of erased memory cells in the respective columns to which they belong and thus cause all the memory cells belonging to these columns to be read as erased irrespective of their actual state.

Hence, the erasure step proper is followed by a step of search and re-programming of the depleted memory cells, known also as "soft-programming", in which there is verified the presence of a leakage current in the columns of the memory array by biasing all the rows of the array at ground voltage.

When a column presenting this anomaly is identified, then the first memory cell of the column is addressed, and a programming pulse having a pre-set amplitude is applied to its gate terminal in order to shift slightly the threshold voltage of the memory cell towards higher values.

This is followed by reading of the second memory cell of the same column: if no leakage current is present in the memory cell, then this means that the depleted memory cell was the preceding one that has already been recovered; otherwise, the memory cell considered is programmed, and so on up to the end of the column.

Once the end of the column has been reached, the verification operation is then repeated, and in the case where a leakage current is still present, the procedure described above is repeated, increasing, however, the amplitude of the programming pulse applied to the gate terminals of the memory cells during programming.

In practice, soft-programming is never carried out on a single memory cell at a time, but rather on a given number of memory cells at a time that is linked to the number of programming circuits (program loads) with which the memory device is provided, currently sixteen. In particular, soft-programming is carried out by addressing a number of memory cells equal to the number of program loads and by soft-programming only those memory cells addressed that effectively require this operation. The number of memory cells that are simultaneously soft-programmed is generally known, in the technical field, as "soft-programming parallelism" or "soft-programming multiplicity".

To compete in the sectors of emerging markets of portable electronic apparatuses, such as, for example, MP3 players and digital cameras, nonvolatile memory devices are currently subject to a revision of their traditional specifications; in particular they are the subject of in-depth studies aimed, among other things, at reducing erasure time.

A contribution to reduction in erasure time could come from the reduction of soft-programming time, which, at least in principle, could be obtained by increasing the parallelism with which this operation is performed.

For example, reduction in soft-programming time could be obtained simply by doubling the number of program loads, but this would entail, in the case where all the memory cells addressed were to require soft-programming, a doubling of the current absorbed in the soft-programming step.

In order to generate this current, it is possible to act in two ways: either to generate the current necessary outside of the memory device, using an appropriate current generator, and supply it to a purposely provided pin of the memory device, or else to double the size of the charge pump, which, in the memory device, is dedicated to the generation of high currents.

The first solution runs, however, counter to the trend of current markets of semiconductor memory devices, which, instead, requires reduction of both the number of voltage supplies in the memory device and their absolute voltage value, whilst the second solution would lead to a significant increase in the area occupied by the charge pump on the silicon and thus to an increase in the cost of the memory device.

BRIEF SUMMARY OF THE INVENTION

A purpose of the present invention is to provide a method for erasing a nonvolatile memory device that will enable a reduction in erasure time with respect to nonvolatile memory devices according to the prior art.

A further purpose of the present invention is to provide a nonvolatile memory device having erasure time shorter than that of nonvolatile memory devices according to the prior art.

According to the present invention, a method for soft-programming an electrically erasable nonvolatile memory device is provided.

According to the present invention an electrically erasable nonvolatile memory device is also provided.

BRIEF DESCRIPTION OF THE DRAWINGS

For a better understanding of the present invention there is now described a preferred embodiment, purely by way of non-limiting example thereof with reference to the attached drawings, in which.

DETAILED DESCRIPTION OF THE INVENTION

Figure 1:
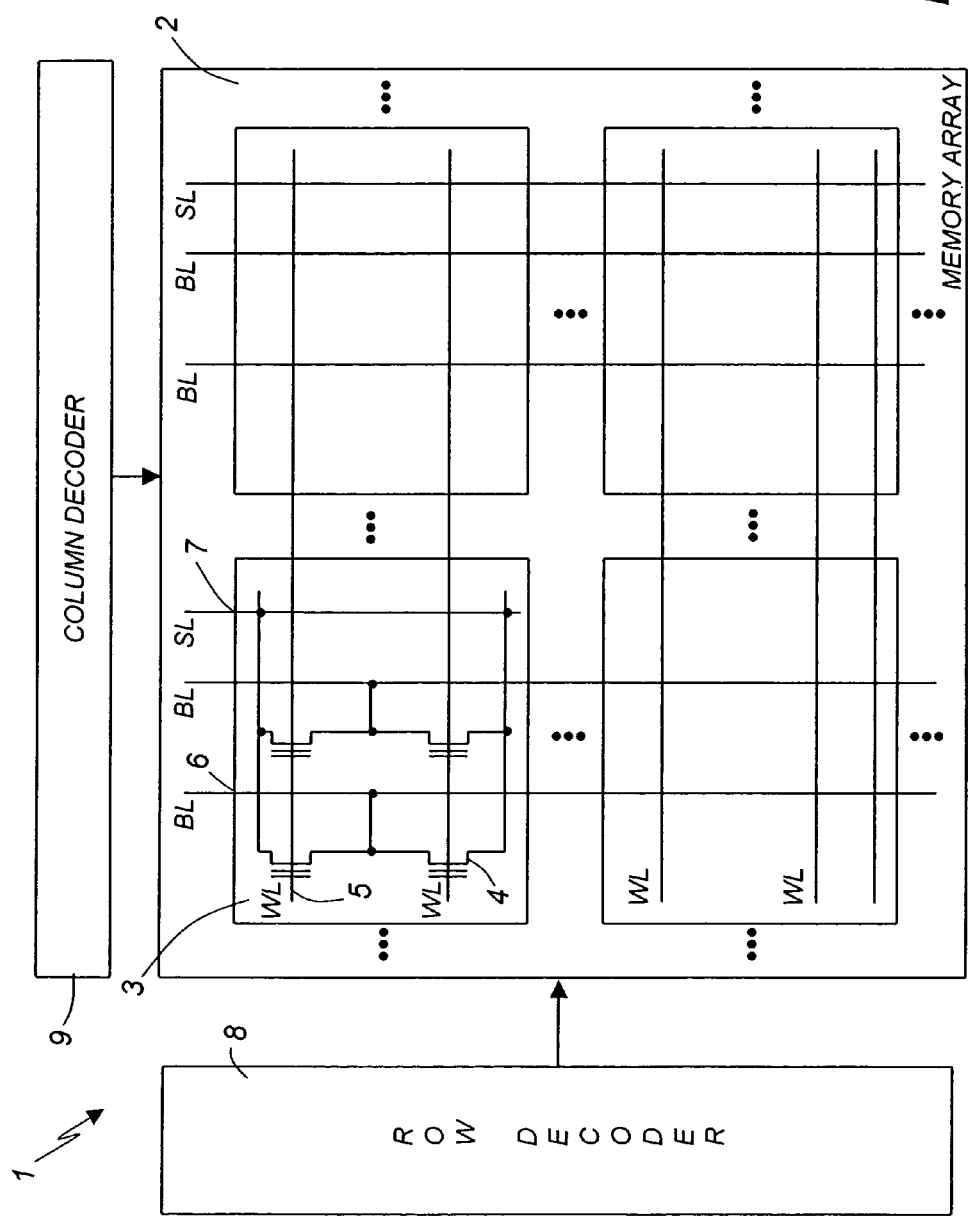
FIG. 1 shows a nonvolatile memory device architecture.

By way of example, FIG. 1 is a schematic illustration of the architecture of a memory device of the type described above, in which the reference number 1 designates, as a whole, the nonvolatile memory device, the reference number 2 designates the memory array, number 3 designates the sectors of the memory array 2, number 4 designates the memory cells, number 5 designates the wordlines, number 6 designates the bitlines, number 7 designates the common line to which the source terminals of all the memory cells 4 belonging to the same sector 3 are connected, number 8 designates the row decoder, and finally number 9 designates the column decoder.

The present invention draws inspiration from the result of a study carried out by the present Applicant on the statistical distribution of depleted memory cells in nonvolatile memory devices. In particular, this study has highlighted that the number of depleted memory cells in a nonvolatile memory device is on average equal to 5% of the total number of memory cells of the memory array, that the depleted memory cells are generally not uniformly distributed within the memory array but rather are localized in a given area of the memory array, and that this different behaviour (depletion) of some memory cells of a sector of the memory array with respect to the remaining part of the memory cells of the sector is explicable with a defectiveness localized in a given area of silicon on which the memory array is made.

Thanks to this and to the fact that typically the bits of a word are not stored in adjacent memory cells of a sector but rather are stored in memory cells distributed in different areas of the sector according to a definite criterion (for example, spaced by 128 columns from one an other, for a device made up of 4096 columns), statistically the probability that a large number of memory cells which store the bits of the same word will be depleted is extremely reduced, so that typically there will be reading errors in just some of the bits of a word stored.

In other words, the distribution of the storage of the bit of the same word within a sector of the memory array, combined with the fact that the defectiveness of the silicon on which the memory array is made is typically localized, renders extremely unlikely that a large number of memory cells that store the bits of the same word will fall within the same defective silicon area, so that typically only a few bits of the word will be affected by the depletion problem.

Drawing inspiration from the experimental findings highlighted above, the idea underlying the present invention is simply that of soft-programming and verifying the memory cells with a multiplicity that is twice (for example 32 bits) that of the one used in programming (for example 16 bits), without any need of supplying from outside the larger current necessary or of increasing the dimensions of the charge pump inside the memory device.

This can be obtained in a simple manner by appropriately modifying the soft-programming algorithm in such a way that it will operate both with the multiplicity used in programming and with a double multiplicity, i.e., twice that used in programming. In particular, in normal operation the soft-programming algorithm operates at double multiplicity (in the example considered, 32 bits), i.e., at the maximum speed, whilst in the case where there is an excessive number of depleted memory cells and it is not possible to soft-program simultaneously the number of memory cells envisaged for double-multiplicity operation because the maximum current required exceeds the capacity of the charge pump, then the soft-programming algorithm passes to operating at single multiplicity, i.e., with the multiplicity used in programming (in the example considered, 16 bits), during which the charge pump is able to supply the maximum current required.

After that two sets of memory cells (in the example considered, two sets of 16 memory cells each) have been programmed at single multiplicity, the soft-programming algorithm returns to operating at double multiplicity.

It can readily be shown that, if w is the number of bits of a word, b is the number of bits stored in depleted memory cells, hereinafter for reasons of brevity referred to as depleted bits, and p is the probability density function of finding b depleted bits on w bits, with p=100*Fb(b) $0 \leq p \leq 100$ and $0 \leq b \leq w$, if the aim is for the soft-programming algorithm to pass to multiplicities lower than the maximum one for a % (e.g., 0<a<100) of the times, for one programming we must have p>a, i.e., $$100 \cdot Fb(p) > a \Rightarrow b = Fb^{-1}\left(\frac{a}{100}\right)$$

where b is the maximum number of depleted bits per word that is found a % of the times.

If B is the maximum number of bits that it is possible to soft-program at a time, which, in the case in point, coincides with w, the maximum multiplicity that can be reached is:

$$N = INT\left(\frac{B}{b}\right) = INT\left(\frac{B}{Fb^{-1}\left(\frac{a}{100}\right)}\right) \cong INT\left(\frac{w}{Fb^{-1}\left(\frac{a}{100}\right)}\right)$$

Considering, for example, memory devices manufactured by using a flash fabrication process known by the code t7x, where the depleted memory cells are found to be 4.3% of the total, from a statistical analysis carried out on typical memory devices the following probability-density function was obtained:

$P(b \leq 0)$=50.78 $P(b \leq 9)$=0.000

$P(b \leq 1)$=17.96 $P(b \leq 10)$=0.00

$P(b \leq 2)$=3.125 $P(b \leq 11)$=0.00

$P(b \leq 3)$=0.781 $P(b \leq 12)$=0.00

$P(b \leq 4)$=0.000 $P(b \leq 13)$=0.00

$P(b \leq 5)$=0.000 $P(b \leq 14)$=0.00

$P(b \leq 6)$=0.000 $P(b \leq 15)$=0.00

$P(b \leq 7)$=0.000 $P(b \leq 16)$=0.00

$P(b \leq 8)$=0.000

Hence, if we wish the probability of passing to lower multiplicity to be 4%, then we have b=2, and for w=16 we obtain N=4, for a total of N*w=4*16=64 soft-programmable bits at a time.

If, instead, we use N=2, for w=16 (N*w=2*16=32 soft-programmable bits at a time), we have b=4 with a probability of passing to multiplicity N=I (N*w=I*16=16 soft-programmable bits at a time) approximately zero.

Figure 2:
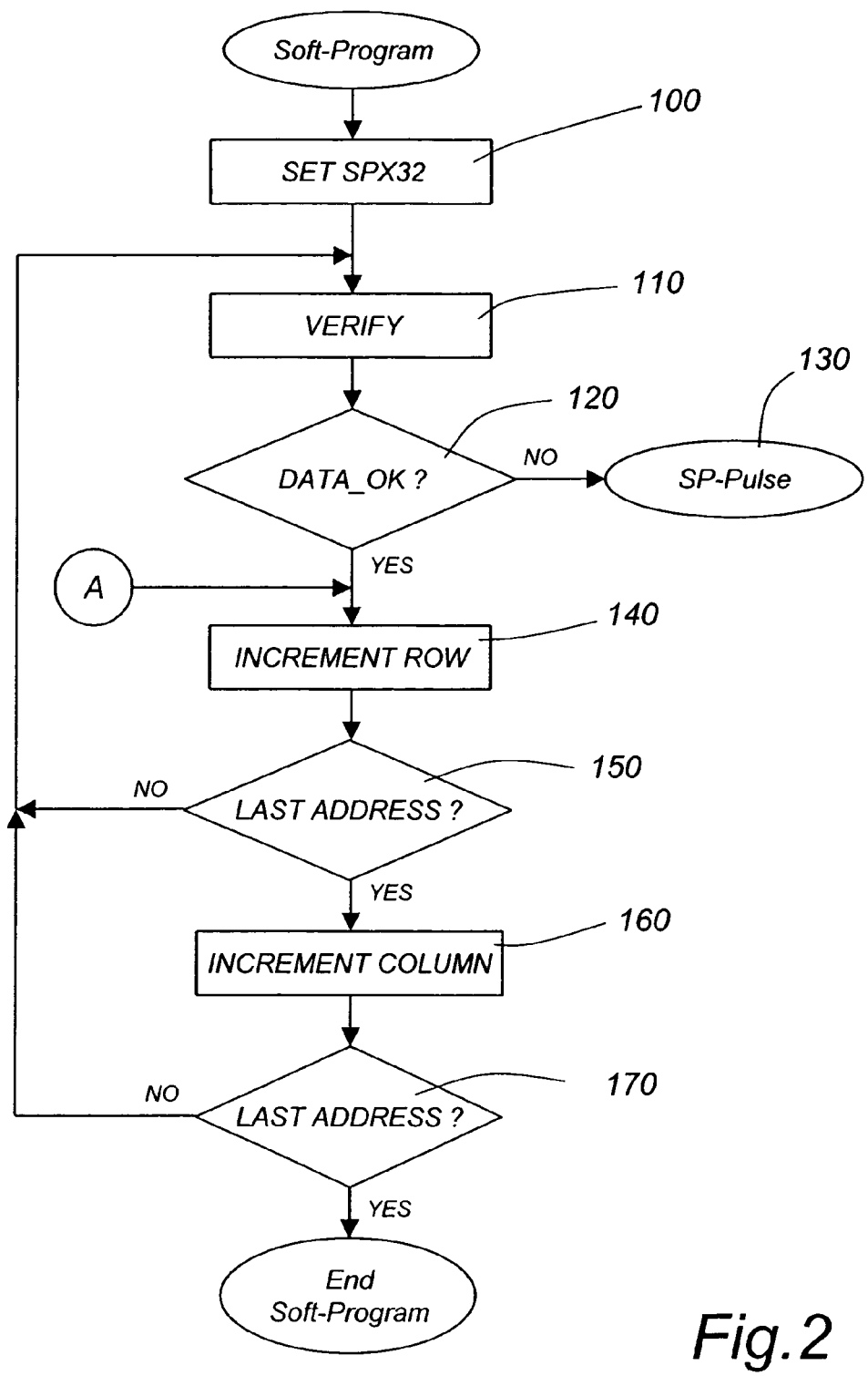
FIGS. 2, 3 and 4 show flowcharts of the operations relative to the erasure method according to the present invention.
Figure 3:
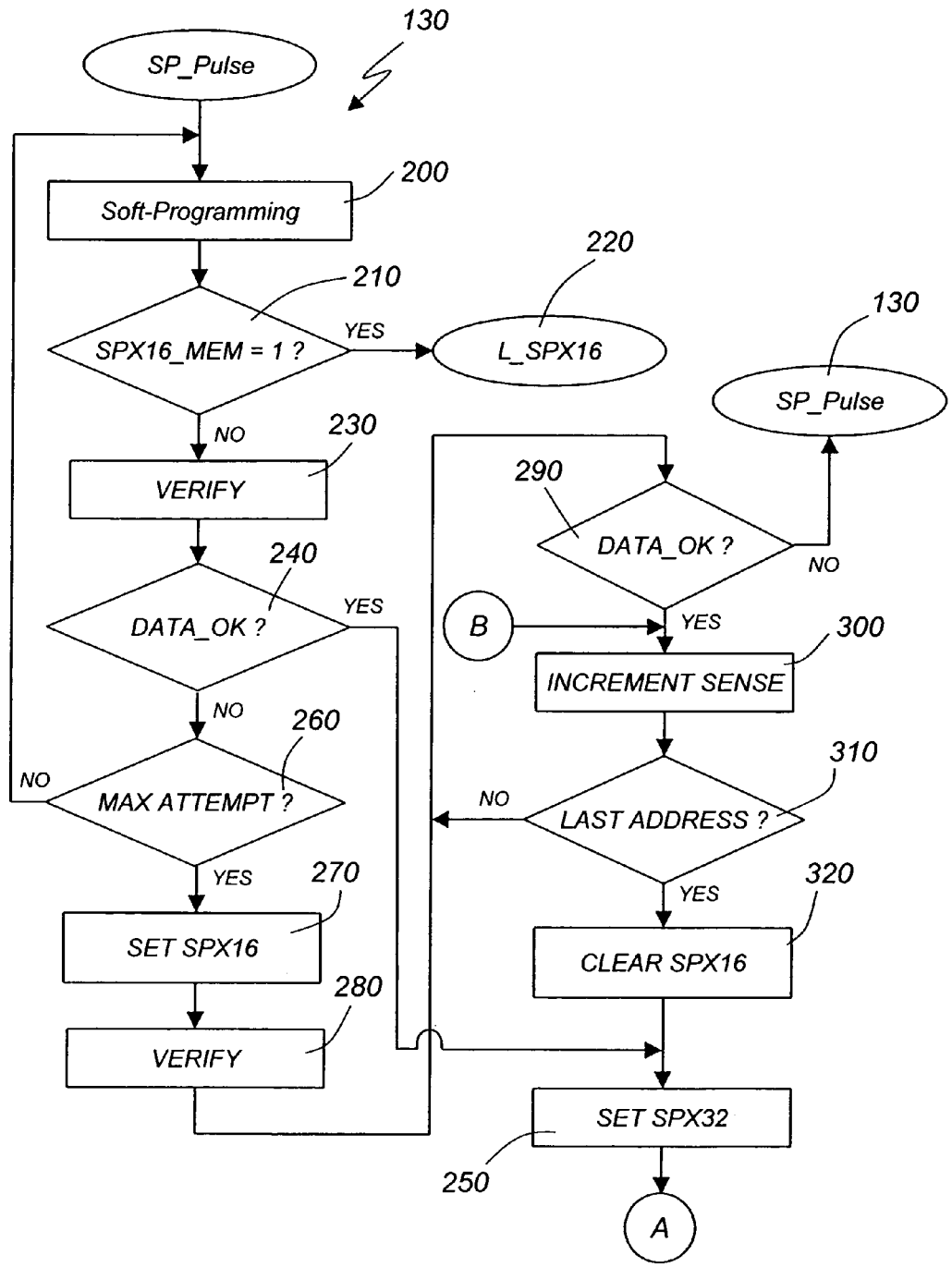
Figure 4:
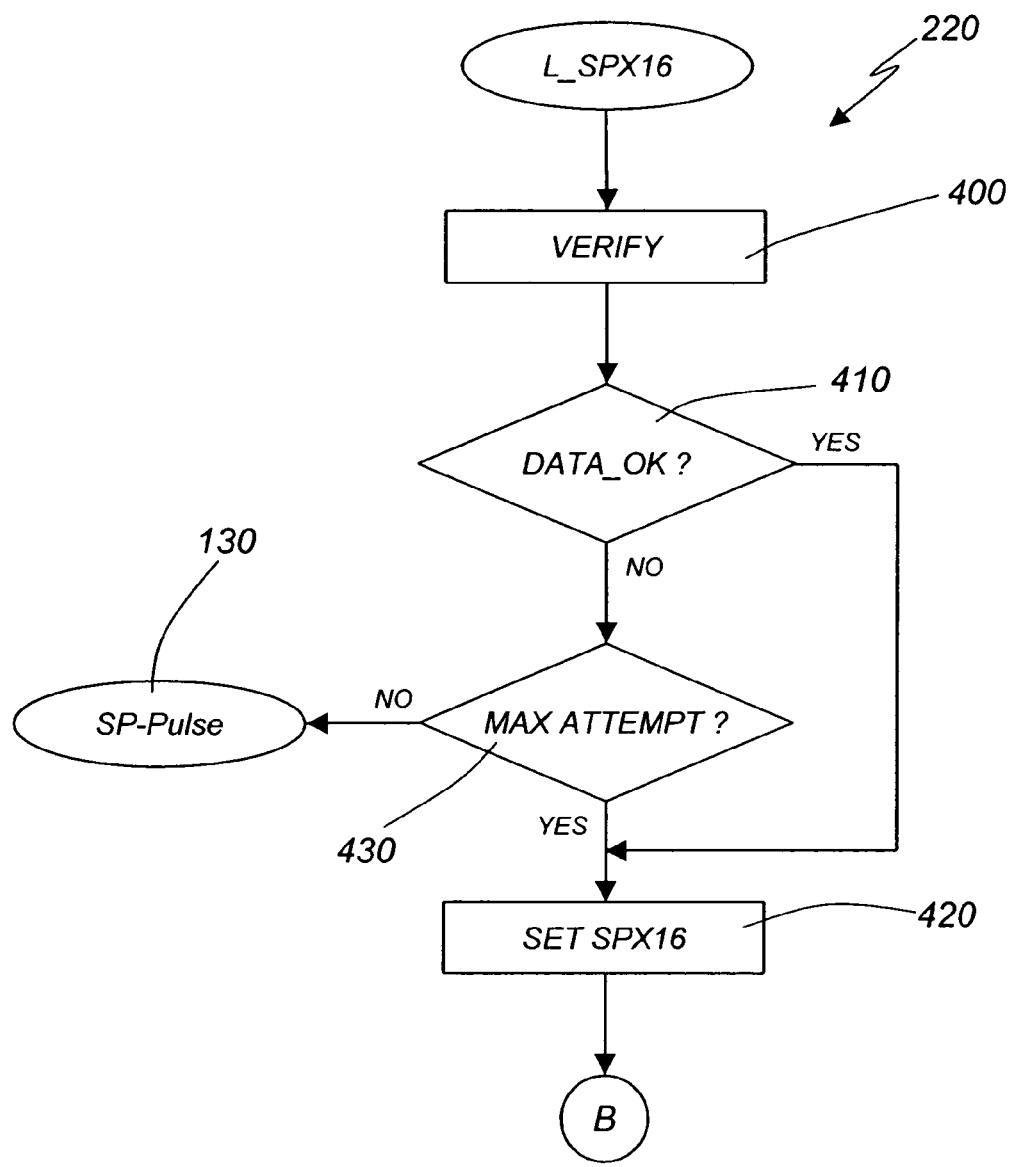

We shall now see specifically, with reference to the flowcharts of FIGS. 2, 3 and 4, how the soft-programming algorithm must be modified for implementing the idea underlying the present invention.

In particular, FIG. 2 presents the flowchart of the operations corresponding to the main routine of the soft-programming algorithm according to the present invention and indicated in FIG. 2 by "Soft-Program", whilst FIGS. 3 and 4 illustrate two routines called by the main routine "Soft-Program" and indicated, respectively, by "SP_Pulse" and "L_SPX16".

Furthermore, for reasons of simplicity of description, there will be considered the case where soft-programming is carried out with 16-bit single multiplicity and 32-bit double multiplicity. It will, however, be immediately clear how what has been said concerning the example considered in FIGS. 2, 3 and 4, is applicable just as it stands to any single and double soft-programming multiplicity that may be adopted.

With reference to FIG. 2, the main routine "Soft-Program" envisages that there is initially set (shown as SET SPX32 in block 100) a 32-bit double soft-programming multiplicity and that the soft-programming multiplicity in use is stored in an appropriate variable SPX16_MEM (block 100). In particular, the variable SPX16_MEM is a variable used for modifying the flow of operations according to the soft-programming multiplicity set and is set at a first logic value, for example "1", if 16-bit single soft-programming multiplicity is set and at a second logic value, in the example considered "0", if 32-bit double soft-programming multiplicity is set.

Next, a verification pulse is applied to a number of memory cells equal to the soft-programming multiplicity set (block 110), i.e., 32 memory cells if the variable SPX16_MEM assumes the logic value "0", or else 16 memory cells if the variable SPX16_MEM assumes the logic value "1", and it is then verified whether there are depleted memory cells or whether, instead, all the memory cells are erased (block 120). For example, the outcome of this verification can conveniently be stored in a logic-state indicator (flag), designated in the figure by "DATA_OK" at block 120, which is set at a first logic value, for example "0", if there are depleted memory cells, and at a second logic state, in the example considered "1", if all the memory cells are erased.

If there are depleted memory cells (output NO from block 120), then the routine SP_Pulse is run, the flowchart of which is illustrated in FIG. 2, whereby soft-programming of the memory cells with single or double soft-programming multiplicity is carried out (block 130), whereas if all the memory cells are erased (output YES from block 120), then the next row is addressed (shown as INCREMENT ROW in block 140), and it is then verified whether the last row address has been reached (block 150). If the last row address has not been reached (output NO from block 150), then control returns to block 110, whereas if the last row address has been reached (output YES from block 150), then the next column is addressed (shown as INCREMENT COLUMN in block 160), and it is verified whether the last column address has been reached (block 170). If the last column address has not been reached (output NO from block 170), then control returns to block 110, whereas if the last column address has been reached (output YES from block 170), then the main routine "Soft-Program" terminates. FIG. 3 illustrates the flowchart of the operations corresponding to the routine SP_Pulse.

According to what is illustrated in FIG. 3, the routine SP_Pulse initially envisages that a number of memory cells equal to the soft-programming multiplicity set will be soft-programmed and stored in the variable SPX16_MEM (block 200).

Next, the content of the variable SPX16_MEM, which stores the soft-programming multiplicity set, is verified (block 210).

If 16-bit single soft-programming multiplicity is set (that is, SPX16_MEM=1? and output YES from block 210), then the routine L_SPX16 is run (block 220), the flowchart of which is again illustrated in FIG. 4, whereas if 32-bit double soft-programming multiplicity is set (output NO from block 210), then a verification pulse is applied to a number of memory cells equal to the soft-programming multiplicity set (block 230), i.e., 32 memory cells, and it is then verified whether amongst them there are depleted memory cells or whether instead they are all erased (whether DATA_OK?=0 or 1, respectively, at block 240).

If all the memory cells to which the verification pulse has been applied are erased (output YES from block 240), then 32-bit double soft-programming multiplicity is set (block 250), and control returns to block 140, indicated by block A in FIGS. 2 and 3, of the main routine "Soft-Program" (FIG. 2 above), whereas if amongst the memory cells to which the verification pulse has been applied there are depleted memory cells (output NO from block 240), then it is verified whether a pre-set maximum number of attempts of soft-programming has been reached (block 260).

If this maximum number of attempts has not yet been reached (MAX ATTEMPT? output is NO from block 260), then control returns to block 200, whereas if the maximum number of attempts has been reached (MAX ATTEMPT? output is YES from block 260), then 16-bit single soft-programming multiplicity is forced, and this is stored in the variable SPX16_MEM (shown as SET SPX16 in block 270).

Next, a verification pulse is applied to a number of memory cells equal to the current soft-programming multiplicity (16-bit) (block 280) and it is then verified whether amongst these there are depleted memory cells or whether, instead, they are all erased (whether DATA_OK?=0 or 1, respectively, at block 290).

If amongst the memory cells to which the verification pulse has been applied there are depleted memory cells (output is 0 or NO from block 290), then there is called again the routine SP_Pulse, whereas if all the memory cells to which the verification pulse has been applied are erased (output is 1 or YES from block 290), then the next set of 16 memory cells is selected (shown as INCREMENT SENSE in block 300), and it is then verified whether the last row or column address has been reached (block 310). If the last row or column address has not been reached (output NO from block 310), then the operations resume from the ones described previously with reference to block 290, whereas if the last row or column address has been reached (output YES from block 310), then the forcing of 16-bit single soft-programming multiplicity is removed ("cleared", as shown as CLEAR SPX16 in block 320), and the storage of this multiplicity is carried out in block 270 (block 320).

Next, control returns to block 250 previously described, in which there is again set 32-bit double soft-programming multiplicity (shown as SET SPX32 in block 250), and thence block 140 of the main routine "Soft-Program" is reached.

FIG. 4 illustrates the flowchart of the operations corresponding to the routine L_SPX16.

According to what is illustrated in FIG. 4, the routine L_SPX16 envisages that initially a verification pulse will be applied to a number of memory cells equal to the current soft-programming multiplicity (16-bit) (block 400) and that then it will be verified whether there are depleted memory cells or whether, instead, all the memory cells are erased (whether DATA_OK?=0 or 1, respectively, at block 410).

If all the memory cells are erased (output 1 or YES from block 410), then 16-bit single soft-programming multiplicity is forced, which is also stored in the variable SPX16_MEM (block 420), whereas if there are depleted memory cells (output 0 or NO from block 410), then it is verified whether a pre-set maximum number of attempts has been reached (shown as MAX ATTEMPT? in block 430).

If this maximum number of attempts has not yet been reached (output NO from block 430), then the routine "SP_Pulse" is recalled, whereas if the maximum number of attempts has already been reached (output YES block 430), then control returns to block 420, in which 16-bit single soft-programming multiplicity is forced, and thence block 300, indicated by block B in FIGS. 3 and 4, of the routine "SP_Pulse" (FIG. 3, above) is reached.

From an examination of the characteristics of the method of erasure according to the present invention, the advantages that it affords are evident.

In particular, the present method of erasure enables a soft-programming time approximately 50% shorter to be obtained than what is obtainable using current soft-programming algorithms, and consequently a total erasure time approximately 5% shorter than that in current memory devices, without the need for any over-sizing of the voltage boosters to supply the current necessary in the worst case.

Exploiting the property of the statistical distribution of the depleted memory cells, it is hence possible to halve the soft-programming time, given the same area occupied on the silicon.

Furthermore, given that, for other needs, typically nonvolatile memory devices are already provided with a number of program loads twice what is strictly necessary in programming, the implementation of the present invention does not even require the introduction of further program loads.

If, instead, the space on the silicon so enables, by doubling the number of program loads already present on the memory devices, it would be possible to reduce still further the soft-programming time and thus the overall erasure time.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is clear that modifications and variations can be made to the method of erasure described and illustrated herein, without thereby departing from the sphere of protection of the present invention, as defined in the annexed claims.

The invention claimed is:

1. A method for soft-programming an electrically erasable nonvolatile memory device, comprising:
    performing a first soft-programming with a first soft-programming multiplicity of memory cells in given operating conditions that are based on a maximum current which is available for writing operations and which can be generated within the memory device, the first soft-programming multiplicity corresponding to simultaneous soft-programming of a first plurality of memory cells of the memory device; and
    performing a second soft-programming of memory cells with a second soft-programming multiplicity differing from the first soft-programming multiplicity in a case where depleted memory cells are still present among the first plurality of memory cells after said first soft-programming, the second soft-programming multiplicity corresponding to simultaneous soft-programming of a second plurality of memory cells of the memory device, said first and second soft-programming being performed without increasing said maximum current which is available for writing operations and which can be generated within the memory device.

2. The soft-programming method according to claim 1 wherein said first soft-programming multiplicity is greater than a programming multiplicity of memory cells used for writing data in the memory device.

3. The soft-programming method according to claim 1 wherein said first soft-programming multiplicity is twice than a programming multiplicity of memory cells used for writing data in the memory device.

4. The soft-programming method according to claim 1 wherein said second soft-programming multiplicity is smaller than said first soft-programming multiplicity.

5. The soft-programming method according to claim 1 wherein said second soft-programming multiplicity is equal to a programming multiplicity of memory cells used for writing data in the memory device.

6. The soft-programming method according to claim 1 wherein said first soft-programming multiplicity is used in a case where a current absorbed during soft-programming carried out with said first soft-programming multiplicity meets a given relation.

7. The soft-programming method according to claim 6 wherein said relation is defined by a condition that the current absorbed during soft-programming carried out with said first soft-programming multiplicity is either smaller or equal to a threshold current.

8. The soft-programming method according to claim 6 wherein said threshold current is equal to said maximum current which is available for writing operations and which can be generated within the memory device.

9. An electrically erasable nonvolatile memory device, comprising:
    first and second pluralities of memory cells; and
    soft-programming means for operating with a first soft-programming multiplicity of memory cells simultaneously on the first plurality of memory cells in given operating conditions that are based on a maximum current which is available for writing operations and which can be generated within the memory device and for operating with a second soft-programming multiplicity of memory cells, simultaneously on the second plurality of memory cells, the second soft-programming multiplicity differing from the first soft-programming multiplicity and being performed in a case where depleted memory cells are still present among the first plurality of memory cells after said first soft-programming.

10. The memory device according to claim 9 wherein said first soft-programming multiplicity is greater than a programming multiplicity of memory cells used for writing data in the memory device.

11. The memory device according to claim 9 wherein said first soft-programming multiplicity is twice a programming multiplicity of memory cells used for writing data in the memory device.

12. The memory device according to claim 9 wherein said second soft-programming multiplicity is smaller than said first soft-programming multiplicity.

13. The memory device according to claim 9 wherein said second soft-programming multiplicity is equal to a programming multiplicity of memory cells used for writing data in the memory device.

14. The memory device according to claim 9 wherein said first soft-programming multiplicity is used in a case where a current absorbed during soft-programming carried out with said first soft-programming multiplicity meets a given relation.

15. The memory device according to claim 14 wherein said relation is defined by a condition that the current absorbed during soft-programming carried out with said first soft-programming multiplicity is smaller or equal to a threshold current.

16. The memory device according to claim 14 wherein said threshold current is equal to said maximum current which is available for writing operations and which can be generated within the memory device.

17. A method for soft-programming an electrically erasable nonvolatile memory device, comprising:
    performing a first soft-programming of a first plurality of memory cells simultaneously;
    performing a second soft-programming of a second plurality of memory cells simultaneously that is fewer than the first plurality of memory cells if a current needed for the first soft-programming is equal to or greater than a maximum current that can be generated during a programming operation; and performing a third soft-programming of a third plurality of memory cells simultaneously that is equal in number to the first plurality of memory cells if the current needed for the first-soft programming is less than the maximum current.

18. The method of claim 17 wherein the first plurality is 32 memory cells that are soft-programmed simultaneously and the second plurality is 16 memory cells that are soft programmed simultaneously.

19. The method of claim 17 wherein the maximum current that can be generated during the programming operation is a maximum current that can be generated by an on-chip charge pump of the memory device.

20. The method of claim 17 wherein the first plurality that are soft-programmed simultaneously is double a number bits that is allowed by a power capability of programming during a normal program operation.

21. The method of claim 17 wherein performing the second soft-programming includes performing the second soft-programming if depleted memory cells among the first plurality of memory cells are present after performing the first soft-programming.

\* \* \* \* \*

UNITED STATES PATENT AND TRADEMARK OFFICE
CERTIFICATE OF CORRECTION

PATENT NO. : 7,120,062 B2  
APPLICATION NO. : 10/779856  
DATED : October 10, 2006  
INVENTOR(S) : La Malfa et al.

It is certified that error appears in the above-identified patent and that said Letters Patent is hereby corrected as shown below:

<u>Title Page</u>  
Item (73), the Assignee's name should read as --STMicroelectronics S.r.I., Agrate Brianza--.

Signed and Sealed this

Fifth Day of June, 2007

JON W. DUDAS  
*Director of the United States Patent and Trademark Office*